United States Patent [19]
McCleaf et al.

[11] Patent Number: 5,155,325
[45] Date of Patent: Oct. 13, 1992

[54] METHOD OF BONDING BY LASER DRIVEN EXPLOSIVE CLADDING

[75] Inventors: Marlin R. McCleaf, Colfax; Jeff C. Wu, Clemmons; Charles W. Himes, Winston-Salem; William E. Pendleton, Greensboro; Richard T. Williams, Winston-Salem, all of N.C.

[73] Assignee: AMP Incorporated, Harrisburg, Pa.

[21] Appl. No.: 740,787

[22] Filed: Aug. 6, 1991

[51] Int. Cl.$^5$ .............................................. B23K 26/00
[52] U.S. Cl. .......................... 219/121.64; 219/121.66; 219/121.74; 219/121.81
[58] Field of Search .............. 219/121.64, 121.63, 219/121.65, 121.66, 121.74, 121.81, 121.85, 121.6

[56] References Cited

U.S. PATENT DOCUMENTS

| | | | |
|---|---|---|---|
| 4,190,759 | 2/1980 | Hongo et al. | 219/121.85 |
| 4,684,781 | 8/1987 | Frish et al. | 219/121.64 X |
| 4,987,006 | 1/1991 | Williams et al. | 427/53.1 |

OTHER PUBLICATIONS

J. L. Edwards, et al. in Metall. Eff. at High Strain Rates, Conf. Proc. Feb. 1973, pp. 559-569, Plenum Press.
Benjamin Cranston, et al. in The Western Electric Engineer, Oct. 1978, pp. 26-35.

*Primary Examiner*—C. L. Albritton
*Attorney, Agent, or Firm*—William B. Noll

[57] ABSTRACT

Invention is directed to a method of metallurgically bonding a layer of a first material, such as gold, to the surface of a second material, such as copper, by the use of the driving force of the energy from a pulsed laser. The method comprises the steps of selecting a thin polymeric film, where said polymer is characterized by a high optical coefficient of absorption at the wavelength of said laser, and applying to said polymeric film a thin layer of said first material for bonding to the second material. The second material is placed in close proximity to the thin layer of the first material. Intermediate the laser and the target a rotating optical scanner is provided to intercept the beam of the laser prior to directing the focused beam thereof toward the polymeric film. The repetition rate of the laser is synchronized with the rotating optical scanner to cause the focused beam of the laser to move across said polymeric film at a velocity less than the velocity of sound through the material. As a result thereof, the polymeric film is explosively evaporated causing a build up of pressure driving the first material toward the second material, whereby a moving contact zone is developed therebetween to drive surface contaminants and oxides from the second material.

7 Claims, 1 Drawing Sheet

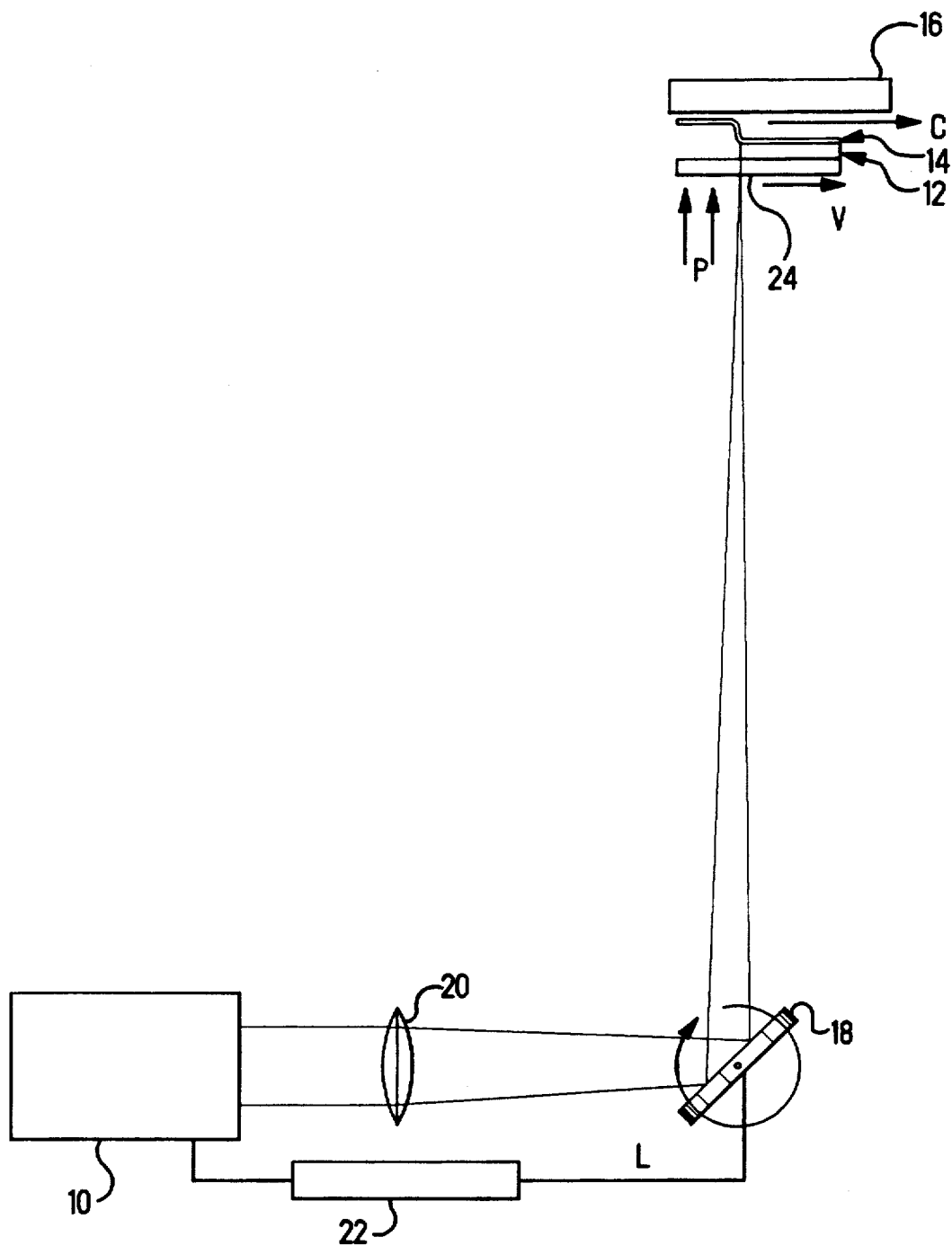

METHOD OF BONDING BY LASER DRIVEN EXPLOSIVE CLADDING

This invention is directed to apparatus and a process for impulse microcladding by moving a long-pulse laser spot as the driving force to effect the plating, such as a thin film of gold onto a substrate, such as metal. More precisely, the invention relates to a system to produce an adherent pressure welded thin metal film, i.e. metallurgically bonded, to a base metal by a laser analog of explosive cladding.

Explosive cladding, particularly by the use of secondary explosives, i.e. requiring detonator cap having a minimum mass for detonation, has been known for a number of years for bonding and cladding of large plates. By employing primary explosives, i.e. detonated by electrical, mechanical or thermal means, it became possible to miniaturize the operation. J. L. Edwards, et al., in *Metall. Eff. at High Strain Rates*, Conf. Proc. February 1973, pp 559–569, Plenum Press, report on the use of primary explosives for miniature bonding applications. They report that electrical connections between metal strips ½ to 10 mils thick and other metals in the form of thick or thin films are examples of explosive bonding applications where the use of a primary explosive is necessary to reduce the scale of bonding to the requirements of the electronics industry.

A similar study is reported by Cranston and his co-workers in *The Western Electric Engineer*, October 1978. The study covers a high energy joining method which has been used to reclad defective or damaged contact fingers of printed circuit boards.

In U.S. Pat. No. 4,987,006, by Williams, et al. and assigned to the assignee hereof, a process is taught for depositing a material, such as gold, onto a substrate by the use of a pulsed laser directed against a polymer film, where the film is highly absorptive at the wavelength of such laser. The laser provides the energy to propel the material to be deposited against the substrate. In a preferred practice of that invention, metal is transferred in solid form by utilizing the supporting polymer film to maintain the integrity of the metal during such transfer. The invention thereof is characterized by the steps of providing a glass or transparent substrate upon which is found a first layer or film of a polymer, where the polymer is highly absorptive of the given wavelength of the pulsed laser, and a second layer or film thereover of a metal to be transfer plated. The workpiece of metal substrate is disposed in close proximity to the second layer or film. A beam of a pulsed laser is then directed through the glass or transparent substrate to at least partially ablate and vaporize the polymer to provide the driving force to propel a portion of the second layer or film toward the metal substrate. As a result, the second layer or film is pressure bonded to the metal substrate.

U.S. Pat. No. 4,684,781, by Frish, et al., teaches a method for bonding using laser induced heat and pressure, by applying a layer of a material to a substrate and generating thermal and pressure waves in the layer by exposing same to high intensity laser radiation. The laser intensity is such as to create an instantaneous surface vaporization of such layer that drives a pressure wave into the layer. The net effect is the production of discrete spot-welds. The patent further discloses scanning apparatus. However, the purpose thereof is to cover the surface with a series of spot or tack welds, each only several hundred microns in size, and a few microns to one hundred microns in thickness, with possible overlapping. Any such overlapping would naturally produce a roughened surface.

The present invention utilizes the inherent advantages associated with the concept of explosive cladding, while avoiding the use of dangerous chemical explosives. It uses laser energy, in a unique manner, to simulate a detonation front during the cladding process.

SUMMARY OF THE INVENTION

The present invention is directed to apparatus, and to the method of using such apparatus to microplate a thin metal film onto a base metal by a laser analog of explosive cladding. The apparatus includes a pulsing laser synchronized to a rotating optical scanner whereby said scanner causes the focused laser spot to move across a polymeric support film at a velocity less than the sound velocity of the target material. The focused spot or beam results in an explosive evaporation of the polymeric film which in turn drives a metal layer thereon toward the target. As a consequence of the moving focused laser spot, oxides and other contaminants are driven ahead of the contact zone.

In the practice of this invention, a thin polymeric support film is selected, where the polymer has a high optical coefficient of absorption to the wavelength of the laser.

BRIEF DESCRIPTION OF DRAWING

The FIGURE is a schematic of the apparatus hereof for practicing the invention.

DETAILED DESCRIPTION OF PREFERRED EMBODIMENT

This invention is directed to a system for impulse microcladding a metal substrate by moving a pulsed laser beam across a cladding metal supported on a thin polymeric film. In the preferred system, the system produces an adherent cold pressure welded gold film on a base metal substrate b a laser analog of explosive cladding.

Explosive cladding, as traditionally practiced by the use of chemical explosives, achieves strong bonds between metal layers because a pressure front moving at the speed of the detonation wave of a chemical explosive layer breaks the oxide layers on the metal parts at the moving zone of plastic deformation. Furthermore, there results in an expulsion of the oxides and contaminants in a "jet" moving just ahead of the contact zone. The practice is effective so long as the velocity of the contact zone is less than the velocity of sound in the respective metals, and the plastic deformation of the parts exceeds the threshold for pressure welding.

The present invention has several advantages not available with traditional explosive cladding. While the invention offers improved film adhesion due to a traveling pressure zone that breaks oxide films and expels contaminants ahead of the contact zone, in a "jet" analogous with conventional explosive cladding, it avoids the use of dangerous chemical explosives, and has the ability to be microminiaturized. Further, a thin layer of metal can be bonded to the substrate without sacrificing the metal. The manner by which these advantages are achieved may be found in the description which follows.

In the practice of this invention, with particular reference to the FIGURE, by way of example, a long-pulsed laser 10, e.g. Nd:YAG (0.5 $\mu$s) or Nd:glass ($\sim$1 $\mu$s)

(without Q-switching), operating at a wavelength of about 1064 nm, is brought to a line focus on an absorbing film 12 of polymer or other material, typically about 1.5 μm to 2.5 μm thick, which is applied to an optically transparent supporting substrate 24 at the laser wavelength, on which a thin metal film 14 has been deposited. Other lasers may be used so long as it is a pulsed laser of relatively long duration, and the polymer used absorbs strongly at the laser wavelength. In any case, the metal film 14 is held in close proximity to a base metal substrate 16 in a geometry similar to conventional explosive cladding. A rapidly rotating mirror 18 or other optical, accousto-optical or electro-optical scanning device causes the line focus to move perpendicular to its length at a velocity of about 1 Km/s, i.e. just less than sound velocity of the respective metals. For example, a mirror spinning at 9000 rpm, placed just after a cylindrical lens 20 with focal length 1 meter, would produce such a moving spot. A 1 μs laser pulse would sweep out an area 1 mm×L, where L is the length of the line focus.

The moving line focused beam vaporizes the absorptive (e.g. polymer) film 12 as it goes, creating a moving pressure front. While the purpose hereof is to essentially vaporize the polymer film, too much laser energy can damage the metal film to be transferred. For example, in laser transfer of gold to copper, an energy density of between 10–35 J/cm$^2$ was sufficient to vaporize the polymer without damaging the gold. In some situations it may be appropriate to use less energy and thereby retain a superficial layer of the polymer film to protect and support the transferred metal film to the substrate. By appropriate choice of scan speed and laser power, by the optional use of a synchronizer 22, the moving front simulates the jet phenomenon of conventional explosive cladding, so that any thin-film metal cladding possible with chemical explosives will be possible by the method of this invention. A synchronizer may be built into the laser to control the firing rate, i.e. repetition rate, of the laser. The repetition rate is determined by the setting of the scan rate. For an external or separate synchronizer, it may consist of an optical (photodiode) pick-off from the mirror, coupled to a conventional electronic trigger delay generator to trigger the laser. In any case, this method gives greater control over the parameters, especially for small, precise cladding jobs, so that some processes not possible with explosives may be possible with the method hereof.

In the preferred practice of this invention, a long pulsed laser, such as Nd:glass is used. The pulse should preferably be at least 0.5 μs. An optimum polymer is polyimide having an absorption coefficient of about 10$^5$ cm$^{-1}$. While this pulse would tend to exclude an excimer laser typically operating in the range of 10–20 ns, it may be suitable if the total energy can be raised to the multi-joule level. It is expected that a number of lasers, using various lasing mediums, may be used herein so long as the duration/energy requirement is satisfied, and the polymer film 12 is highly absorptive at the wavelength of the selected laser.

With the selected laser operating as required, it may be helpful to analyze the activity occurring at the laser target. An explosive vaporization of the absorptive film 12 occurs at an instantaneous position of focus, creating pressure (P), to drive the metal film 14 toward and in contact with metal substrate 16. The pressure P may be on the order of 200,000 psi. As a consequence of this dynamic process, contaminants and oxides (C) are driven ahead of the contact zone whereby to expose a clean substrate to contact and bonding of the metal film 14 thereagainst.

A significant feature hereof is the fact that the velocity (V) of the contact zone is less than the velocity of sound in the respective metals, i.e. substrate 16 and metal film 14.

We claim:

1. A method of pressure bonding a layer of a first material to the surface of a second material by the use of the driving force of the energy from a pulsed laser, comprising the steps of:
   (a) selecting a thin polymeric film, where said polymer is characterized by a high optical coefficient of absorption at the wavelength of said laser,
   (b) applying to said polymeric film a thin layer of said first material for bonding to said second material,
   (c) placing said second material in close proximity to the thin layer of said first material,
   (d) arranging a rotating optical scanner to intercept the beam of a laser prior to directing the focused beam thereof toward said polymeric film,
   (e) synchronizing the laser pulse to the rotating optical scanner to cause the focused beam of the laser to move across said polymeric film at a velocity less than the velocity of sound through said materials, and
   (f) directing pulsed laser energy toward said optical scanner, then toward said polymeric film, where said polymeric film is explosively evaporated causing a build up of pressure driving said first material toward said second material, whereby a moving contact zone is developed therebetween.

2. The method according to claim 1 wherein surface oxides and contaminants at the interface between said first and second materials are driven ahead of the contact zone.

3. The method according to claim 1 wherein said first material is selected from the group of metals, including gold, gold alloys, palladium, and palladium alloys, and composite layers thereof.

4. The method according to claim 3 wherein said second material is a metal.

5. The method according to claim 1 wherein said polymeric film has a thickness of between 1.5 and 2.5 μm.

6. The method according to claim 5 wherein said polymeric film is supported on a material which has a low optical absorption coefficient at the wavelength of said laser.

7. The method according to claim 1 wherein said laser is operating at a wavelength of about 1064 nm.

* * * * *